(12) United States Patent
Maeda et al.

(10) Patent No.: US 12,326,656 B2
(45) Date of Patent: Jun. 10, 2025

(54) MASK BLANK AND METHOD OF MANUFACTURING PHOTOMASK

(71) Applicants: HOYA CORPORATION, Tokyo (JP); TEKSCEND PHOTOMASK CORP., Tokyo (JP)

(72) Inventors: Hitoshi Maeda, Tokyo (JP); Kazutake Taniguchi, Tokyo (JP); Kazuaki Matsui, Tokyo (JP); Naoto Yonemaru, Tokyo (JP)

(73) Assignees: HOYA CORPORATION, Tokyo (JP); TEKSCEND PHOTOMASK CORP., Tokyo (JP)

( * ) Notice: Subject to any disclaimer, the term of this patent is extended or adjusted under 35 U.S.C. 154(b) by 539 days.

(21) Appl. No.: 17/799,573

(22) PCT Filed: Feb. 16, 2021

(86) PCT No.: PCT/JP2021/005627
§ 371 (c)(1),
(2) Date: Aug. 12, 2022

(87) PCT Pub. No.: WO2021/192734
PCT Pub. Date: Sep. 30, 2021

(65) Prior Publication Data
US 2023/0069092 A1   Mar. 2, 2023

(30) Foreign Application Priority Data
Mar. 23, 2020   (JP) ................... 2020-050946

(51) Int. Cl.
*G03F 1/32*      (2012.01)
*G03F 1/50*      (2012.01)
(Continued)

(52) U.S. Cl.
CPC ............. *G03F 1/32* (2013.01); *G03F 1/50* (2013.01); *G03F 1/54* (2013.01); *G03F 1/80* (2013.01); *H01L 21/3065* (2013.01)

(58) Field of Classification Search
CPC ..... G03F 1/32; G03F 1/50; G03F 1/54; G03F 1/80; G03F 1/38; G03F 1/48
See application file for complete search history.

(56) References Cited

U.S. PATENT DOCUMENTS

| | | |
|---|---|---|
| 2010/0081066 A1 | 4/2010 | Nozawa |
| 2015/0086909 A1 | 3/2015 | Yoshii et al. |

(Continued)

FOREIGN PATENT DOCUMENTS

| | | |
|---|---|---|
| JP | 4989800 B2 | 8/2012 |
| JP | 2016-188958 A | 11/2016 |

(Continued)

OTHER PUBLICATIONS

Mar. 28, 2024 Extended European Search Report issued in European Patent Application No. 21774076.0.
(Continued)

*Primary Examiner* — Stewart A Fraser
(74) *Attorney, Agent, or Firm* — Oliff PLC

(57) ABSTRACT

A mask blank has a structure where a thin film for pattern formation and a hard mask film are stacked in this order on a transparent substrate, featured in that the thin film is formed of a material containing chromium, the hard mask film includes a stacked structure of a lower layer and an upper layer, the lower layer is formed of a material containing silicon and oxygen, the upper layer is formed of a material containing tantalum and oxygen with an oxygen content of 30 atom % or more, and the ratio of a thickness of the upper layer relative to a total thickness of the hard mask film is 0.7 or less.

10 Claims, 3 Drawing Sheets

(51) Int. Cl.
*G03F 1/54* (2012.01)
*G03F 1/80* (2012.01)
*H01L 21/3065* (2006.01)

(56) References Cited

U.S. PATENT DOCUMENTS

| | | |
|---|---|---|
| 2017/0168384 A1 | 6/2017 | Shishido et al. |
| 2018/0129130 A1 | 5/2018 | Shishido et al. |
| 2022/0075258 A1* | 3/2022 | Shin .......................... G03F 1/80 |

FOREIGN PATENT DOCUMENTS

| | | |
|---|---|---|
| JP | 2016-212322 A | 12/2016 |
| JP | 2017-058703 A | 3/2017 |
| JP | 6234898 B2 | 11/2017 |
| JP | 2017-223905 A | 12/2017 |
| JP | 2019-179106 A | 10/2019 |
| JP | 2020-020868 A | 2/2020 |

OTHER PUBLICATIONS

Apr. 20, 2021 Search Report issued in International Patent Application No. PCT/JP2021/005627.

* cited by examiner

[FIG. 1]
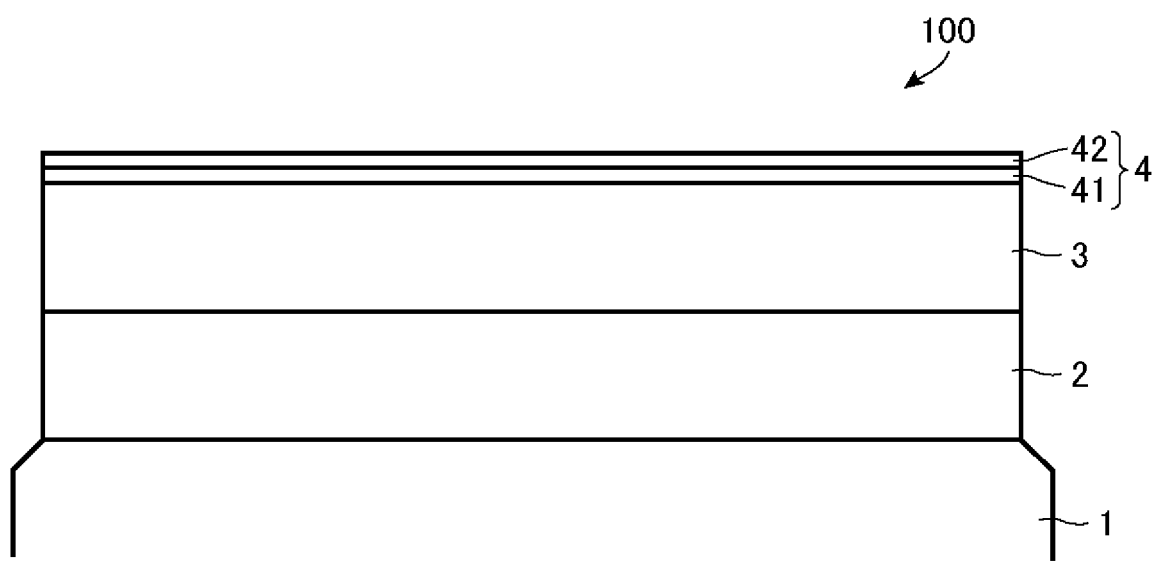

[FIG. 2]
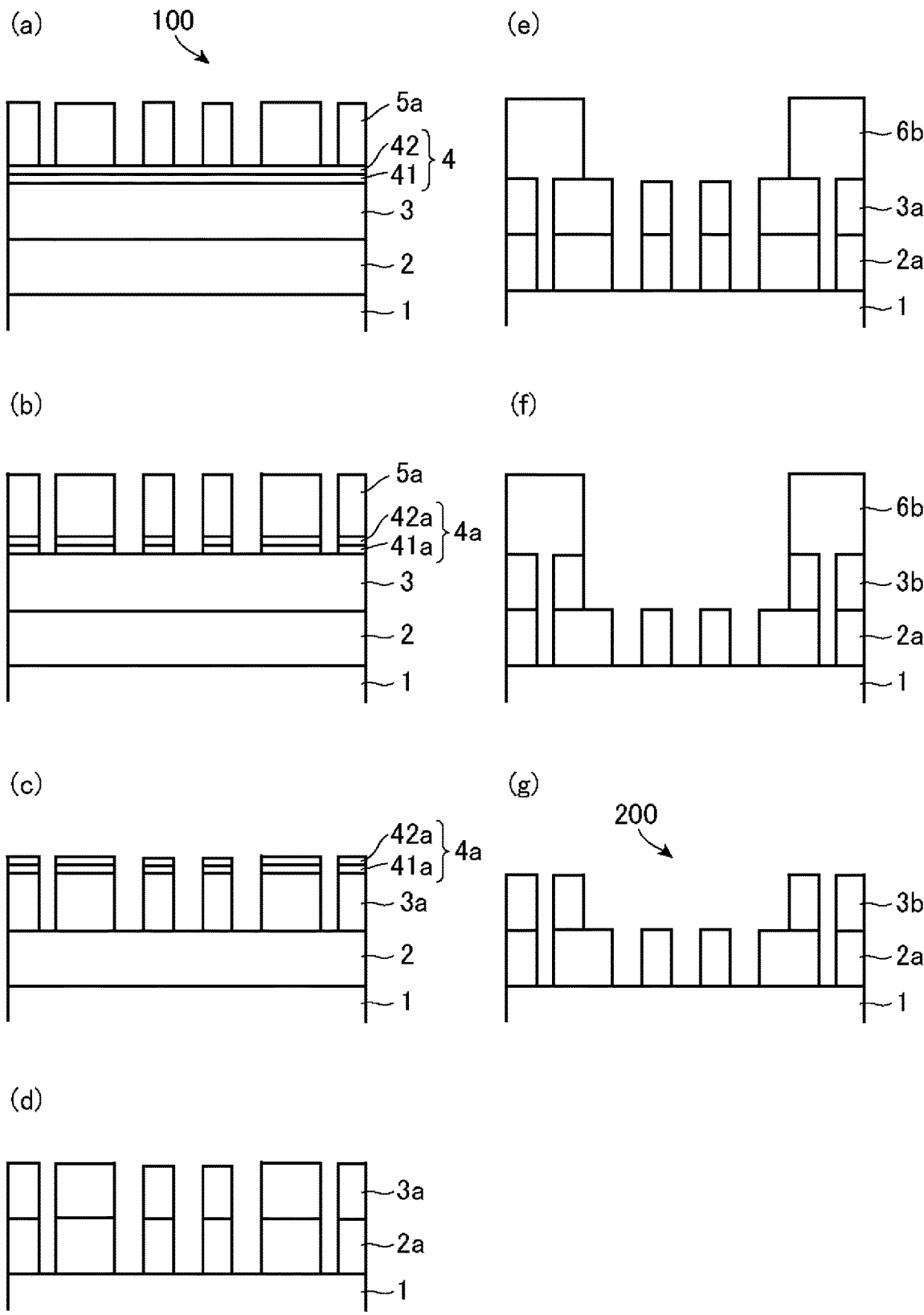

[FIG. 3]
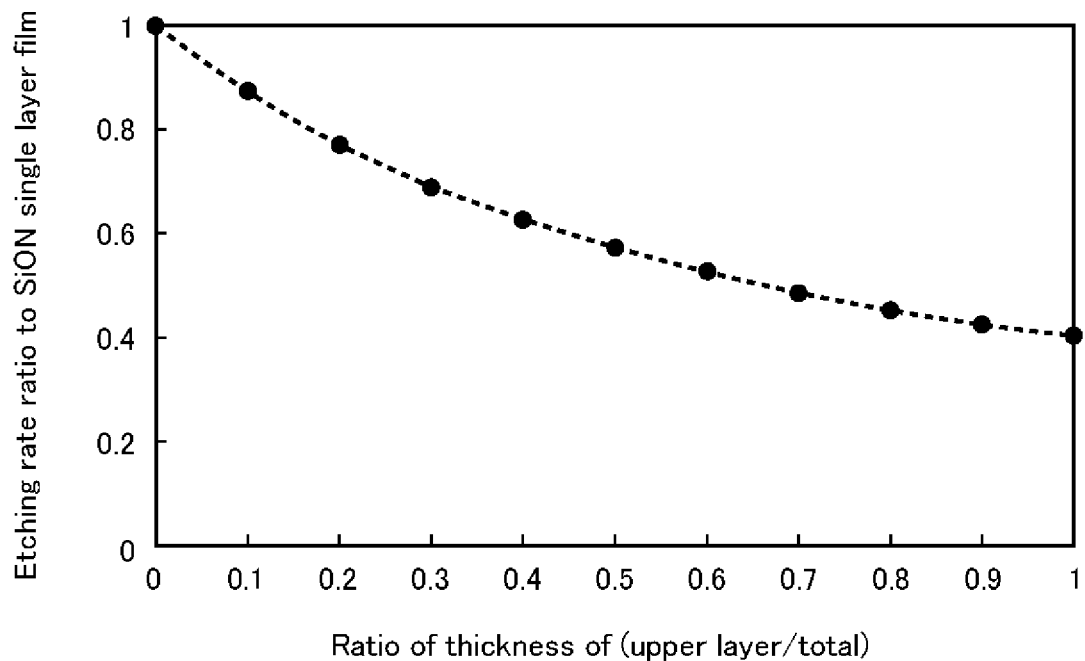

MASK BLANK AND METHOD OF MANUFACTURING PHOTOMASK

TECHNICAL FIELD

This invention relates to a mask blank, and a method of manufacturing a photomask using the mask blank.

BACKGROUND ART

As a mask blank for a half tone phase shift mask, a mask blank having a structure where a half tone phase shift film including a metal silicide-based material, an absorber film including a chromium-based material, and an etching mask film (hard mask film) including an inorganic material are stacked on a transparent substrate has been known. In the case of manufacturing a phase shift mask using this mask blank, initially, an etching mask film is patterned through dry etching by fluorine-based gas with a resist pattern formed in a surface of the mask blank as a mask, subsequently an absorber film is patterned through dry etching by mixed gas of chlorine and oxygen with the etching mask film as a mask, and further, a phase shift film is patterned through dry etching by fluorine-based gas with a pattern of the absorber film as a mask.

For example, Patent Document 1 describes that using an inorganic film containing silicon as a hard mask and forming a resist film on an inorganic film containing silicon by coating cause a problem of poor adhesiveness of a resist, where peeling occurs when a resist pattern is developed. To improve adhesiveness of the resist film, Patent Document 1 describes the need to treat a surface of an inorganic film containing silicon with silylation processing using hexamethyldisilazane, etc.

Further, Patent Document 2 discloses a mask blank having a structure where an etching mask film (hard mask film) and a conductive mask film are stacked in this order on a chromium-based absorber film. The two films, i.e., the etching mask film and the conductive mask film, work as a hard mask relative to the absorber film. SiON is exemplified as a material of the etching mask film, and TaN is exemplified as a material of the conductive mask film.

Further, Patent Document 3 discloses a mask blank having a structure where a hard mask film is stacked on a chromium-based absorber film. The hard mask film is formed of a material containing tantalum and oxygen, with an oxygen content of 50 atom %.

PRIOR ART PUBLICATIONS

Patent Documents

Patent Document 1

Japan Patent No. 6234898

Patent Document 2

Japan Patent No. 4989800

Patent Document 3

Japanese Patent Application Publication 2016-188958

SUMMARY OF THE INVENTION

Problems to be Solved by the Invention

Together with further miniaturization of semiconductor devices, further enhancement of CD precision (CD: Critical Dimension) of a pattern for a photomask is required. In the case of using a conventional mask blank in which a surface of a hard mask film of Si-based material is silylated and thereafter a resist film was formed by coating, and when the resist film was subjected to an exposure-transfer writing of a fine pattern and development, there was a problem of insufficient pattern resolution, in-plane CD uniformity (CDU), and CD linearity (CDL) in the resulting resist pattern.

It was found that the use of a hard mask film of a tantalum-based material results in sufficiently high adhesiveness with a resist film, without silylation processing. It was also found that when the resist film formed by coating was subjected to an exposure-transfer writing of a fine pattern and development to form a resist pattern, pattern resolution, in-plane CD uniformity (CDU), and CD linearity (CDL) of the resist pattern become higher than those of a hard mask film of a Si-based material.

A thin film of a tantalum-based material is known as easily oxidized. Further, a hard mask film has less film thickness than when used for an absorber film to exhibit its function. When a hard mask film is formed of a tantalum-based material, oxidization is likely to advance throughout the thin film. Considering stability of composition after forming a thin film, it is considered as preferable for a hard mask film to contain a certain amount or more oxygen (30 atom % or more).

Generally, a thin film of silicon-based material and a thin film of tantalum-based material are both patterned through dry etching using fluorine-based gas. However, a thin film of tantalum-based material has a problem in slow etching rate compared to a thin film of silicon-based material. Since the purpose of providing a hard mask film is to reduce a film thickness of a resist film, slow etching rate is particularly a problem in forming a hard mask film with a tantalum-based material. Namely, when a hard mask film was formed with a tantalum-based material, and in forming a pattern in the hard mask film by dry etching, there was a problem of the necessity to increase a thickness of the resist film compared to when the hard mask film was formed of a silicon-based material. Moreover, since a thicker resist film causes reduction in all of resolution, in-plane CD uniformity, and CD linearity of a resist pattern, there was a problem in losing superiority over a hard mask film formed of a silicon-based material.

This invention was made to solve the above problems. An object of this invention is to provide a mask blank that can prevent reduction of an etching rate of an entire hard mask film while enhancing pattern resolution, in-plane CD uniformity, and CD linearity. Moreover, this invention provides a method of manufacturing a photomask in which by using the mask blank, a precise, fine pattern can be formed in a thin film for pattern formation.

Means for Solving the Problem

As means for solving the above problems, this invention includes the following configurations.

Configuration 1

A mask blank having a structure where a thin film for pattern formation and a hard mask film are stacked in this order on a transparent substrate, in which the thin film is formed of a material containing chromium, in which the hard mask film has a stacked structure of a lower layer and an upper layer, in which the lower layer is formed of a material containing silicon and oxygen, in which the upper layer is formed of a material containing tantalum and oxygen and containing the oxygen of 30 atom % or more, and in which a ratio of a thickness of the upper layer relative to a total thickness of the hard mask film is 0.7 or less.

Configuration 2

The mask blank according to Configuration 1, in which the upper layer has a thickness of 1 nm or more.

Configuration 3

The mask blank according to Configuration 1 or 2, in which the hard mask film has a thickness of 4 nm or more and 14 nm or less.

Configuration 4

The mask blank according to any of Configurations 1 to 3, in which the upper layer contains boron.

Configuration 5

The mask blank according to any of Configurations 1 to 4, in which the lower layer is formed of a material with a total content of silicon and oxygen of 96 atom % or more, or a material with a total content of silicon, nitrogen, and oxygen of 96 atom % or more.

Configuration 6

The mask blank according to any of Configurations 1 to 5, in which the upper layer is formed of a material with a total content of tantalum and oxygen of 90 atom % or more, or a material with a total content of tantalum, oxygen, and boron of 90 atom % or more.

Configuration 7

The mask blank according to any of Configurations 1 to 6, in which the thin film is an absorber film.

Configuration 8

The mask blank according to any of Configurations 1 to 7 including a phase shift film consisting of a material containing silicon between the transparent substrate and the absorber film.

Configuration 9

A method of manufacturing a photomask using the mask blank according to any of Configurations 1 to 7, including the steps of:
forming a resist pattern on a hard mask film of the mask blank,
dry-etching the hard mask film with fluorine-based gas with the resist pattern as a mask to form a hard mask pattern, and
dry-etching the thin film for pattern formation with mixed gas of chlorine and oxygen with the hard mask pattern as a mask to form a thin film pattern.

Configuration 10

A method of manufacturing a photomask using the mask blank according to Configuration 8, including the steps of:
forming a resist pattern on a hard mask film of the mask blank,
dry-etching the hard mask film with fluorine-based gas with the resist pattern as a mask to form a hard mask pattern,
dry-etching the absorber film with mixed gas of chlorine and oxygen with the hard mask pattern as a mask to form an absorber film pattern, and
dry-etching the phase shift film with fluorine-based gas with the absorber film pattern as a mask to form a phase shift film pattern while removing the hard mask pattern.

Effect of the Invention

According to the mask blank of this invention having the above configurations, by forming an upper layer of a hard mask film from a material containing tantalum and oxygen, pattern resolution, in-plane CD uniformity, and CD linearity of a resist pattern can be enhanced when the resist film is formed by coating on the hard mask film and subjected to an exposure-transfer writing of a fine pattern and development to form a resist pattern. Moreover, with a ratio of a thickness of the upper layer to a total thickness of the hard mask film of 0.7 or less and by forming the lower layer of the hard mask film from a material containing silicon and oxygen, reduction of an etching rate of the entire hard mask film to fluorine-based gas can be suppressed.

BRIEF DESCRIPTION OF THE DRAWINGS

FIG. 1 is a schematic cross-sectional view of an embodiment of the mask blank.

FIG. 2 is a schematic cross-sectional view showing a manufacturing step of a phase shift mask.

FIG. 3 shows a relationship between a ratio of a thickness of the upper layer relative to a total thickness of the hard mask film and a ratio of an etching rate of the entire hard mask film to an etching rate of a SiON single layer film.

EMBODIMENTS FOR CARRYING OUT THE INVENTION

The detailed configurations of each embodiment of this invention are described below together with the drawings. Same reference numerals are applied in the drawings for similar components.

<Mask Blank>

FIG. 1 shows a schematic configuration of an embodiment of a mask blank. A mask blank 100 shown in FIG. 1 has a configuration where one main surface of a transparent substrate 1 has a phase shift film 2, an absorber film 3, and a hard mask film 4 stacked in this order. Further, the mask blank 100 can have a configuration where the hard mask film 4 has a resist film stacked thereon as desired. The detail of major configuration of the mask blank 100 is explained below.

[Transparent Substrate]

The transparent substrate 1 is formed of materials having a good transmittance to exposure light used in an exposure step in lithography. Such materials include synthetic quartz glass, aluminosilicate glass, soda-lime glass, low thermal expansion glass ($SiO_2$—$TiO_2$ glass, etc.), and various other glass substrates can be used. Particularly, a substrate using synthetic quartz glass has a high transmittance to ArF excimer laser light (wavelength: about 193 nm), which can be used preferably as the transparent substrate 1 of the mask blank 100.

The exposure step in lithography as used herein refers to an exposure step of lithography using a phase shift mask produced by using the mask blank 100, and the exposure light hereinafter means exposure light used in the exposure step. As the exposure light, any one of ArF excimer laser light (wavelength: 193 nm), KrF excimer laser light (wavelength: 248 nm), and i-line light (wavelength: 365 nm) can be applied, but in view of miniaturizing a phase shift film pattern in the exposure step, it is preferable to apply ArF excimer laser light as the exposure light. Therefore, embodiments in the case where ArF excimer laser light is applied as exposure light are described below.

[Phase Shift Film]

The phase shift film 2 has a predetermined transmittance to exposure light used in an exposure transfer step, and has an optical characteristic where exposure light transmitted through the phase shift film 2 and exposure light transmitted through the atmosphere for the same distance as the thickness of the phase shift film 2 have a predetermined phase difference.

The phase shift film 2 as above is preferably formed of a material containing silicon (Si). Further, the phase shift film 2 is preferably formed of a material containing nitrogen (N), in addition to silicon. The phase shift film 2 as above can be patterned through dry etching using fluorine-based gas, and a material is used which has sufficient etching selectivity to the absorber film 3 containing chromium mentioned below.

If capable of being patterned through dry etching using fluorine-based gas, the phase shift film 2 can further contain one or more elements selected from metalloid elements, non-metallic elements, and metal elements.

Among the above, the metalloid elements can be any metalloid elements in addition to silicon. Non-metallic elements can be any non-metallic elements in addition to nitrogen, preferably containing one or more elements selected from, for example, oxygen (O), carbon (C), fluorine (F), and hydrogen (H). Metal elements include molybdenum (Mo), tungsten (W), titanium (Ti), tantalum (Ta), zirconium (Zr), hafnium (Hf), niobium (Nb), vanadium (V), cobalt (Co), chromium (Cr), nickel (Ni), ruthenium (Ru), tin (Sn), boron (B), and germanium (Ge).

The phase shift film 2 as mentioned above is formed of, for example, MoSiN; refractive index n, extinction coefficient k, and film thickness of the phase shift film 2 are selected respectively to satisfy a predetermined phase difference (e.g., 150 degrees to 210 degrees) and a predetermined transmittance (e.g., 1% to 30%) to exposure light (e.g., ArF excimer laser light); and composition of the film material and film forming condition are adjusted to achieve the refractive index n and the extinction coefficient k.

[Absorber Film]

The mask blank 100 of this embodiment includes an absorber film 3 as a thin film for transfer pattern formation. The absorber film 3 is a film forming an absorber film pattern including a light shielding band pattern formed on the mask blank 100, having light shielding property to exposure light used in exposure step in lithography. The absorber film 3 of a stacked structure with the phase shift film 2 is expected to have more than 2.0, preferably 2.8 or more, and more preferably 3.0 or more optical density (OD) to, for example, ArF excimer laser light of wavelength 193 nm. Further, to prevent defects in exposure transfer by reflection of exposure light in an exposure step in lithography, surface reflectance of exposure light is suppressed at a low rate at both main surfaces. Particularly, reflectance of a surface side of the absorber film 3 (surface that is the farthest from the transparent substrate 1) onto which reflected light of exposure light from an optical reduction system of an exposure apparatus hits is preferably, for example, 40% or less (preferably 30% or less). This is to suppress stray light that is generated from multiple reflections between the surface of the absorber film 3 and the optical reduction system lens.

Further, the absorber film 3 should function as an etching mask upon dry etching by fluorine-based gas for forming a transfer pattern (phase shift film pattern) on the phase shift film 2. Therefore, the absorber film 3 should be formed of materials having sufficient etching selectivity to the phase shift film 2 upon dry etching by fluorine-based gas. It is expected for the absorber film 3 to precisely form a fine pattern that is to be formed in the phase shift film 2. A film thickness of the absorber film 3 is preferably 70 nm or less, more preferably 65 nm or less, and particularly preferably 60 nm or less. When a film thickness of the absorber film 3 is too thick, the fine pattern to be formed cannot be created at a high precision. On the other hand, it is expected for the absorber film 3 to satisfy an expected optical density as mentioned above. Therefore, a film thickness of the absorber film 3 is expected to be greater than 15 nm, preferably 20 nm or more, and further preferably 25 nm or more.

The absorber film 3 is formed of a material containing chromium. The material containing chromium can contain chromium alone, and also chromium and additional elements. Oxygen and/or nitrogen are preferable as the additional elements for being capable of accelerating dry-etching speed. In addition to the above, the absorber film 3 can contain elements such as carbon, hydrogen, boron, indium, tin, and molybdenum.

The absorber film 3 can be formed on the phase shift film 2 through reactive sputtering method using a target containing chromium. As the sputtering method, a sputtering using direct current (DC) power source (DC sputtering), or a sputtering using radio-frequency (RF) power source (RF sputtering) can be used. In addition, magnetron sputtering method and conventional method can also be used. DC sputtering is preferable for having a simple mechanism. Magnetron sputtering method is preferable for increasing deposition rate and enhancing productivity. Incidentally, a film-forming apparatus can be an in-line type or a single-wafer type.

Materials of the target can include, not only a simple substance of chromium, but chromium as a major substance, and chromium including any one of oxygen and carbon, or a combination of oxygen and carbon added to chromium can be used as the target.

[Hard Mask Film]

The hard mask film 4 is provided on the absorber film 3. The hard mask film 4 is a film formed of a material having etching durability to etching gas used in etching the absorber film 3. It is sufficient for the hard mask film 4 to have a film thickness that can function as an etching mask until dry etching for forming a pattern in the absorber film 3 is completed, and basically is not restricted with respect to optical characteristics. Therefore, a thickness of the hard mask film 4 can be reduced significantly compared to a thickness of the absorber film 3.

A thickness of the hard mask film 4 is preferably 14 nm or less, and more preferably 10 nm or less. This is because if the hard mask film 4 is too thick, a resist film needs to have a thickness for an etching mask in dry etching to form an absorber film pattern in the hard mask film 4. A thickness of the hard mask film 4 is preferably 4 nm or more, and more preferably 5 nm or more. This is because if the hard mask film 4 is too thin, there is a risk that the pattern of the hard mask film 4 disappears before completion of dry etching in forming an absorber film pattern in the absorber film 3 depending on the condition of dry etching by oxygen-containing chlorine-based gas.

It is sufficient for the resist film of an organic-based material used as an etching mask in dry etching by fluorine-based gas for forming a pattern in the hard mask film 4 to have a film thickness that can function as an etching mask until dry etching of the hard mask film 4 is completed. Therefore, providing the hard mask film 4 can significantly reduce the thickness of the resist film compared to conventional configurations without the hard mask film 4.

The hard mask film 4 includes a stacked structure of a lower layer 41 and an upper layer 42.

The lower layer 41 is preferably formed of a material containing silicon and oxygen. It is preferable to employ $SiO_2$, SiON, etc. as a material containing silicon and oxygen. The lower layer 41 is preferably formed of a material with a total content of silicon and oxygen of 96 atom % or more, or a material with a total content of silicon, nitrogen, and oxygen of 96 atom % or more. Accordingly, content of other elements can be suppressed below 4 atom %, ensuring good etching rate.

The upper layer 42 is preferably formed of a material containing tantalum and oxygen. The material containing tantalum and oxygen in this case includes a material containing tantalum and oxygen, and one or more elements selected from nitrogen, boron, and carbon, for example, TaO, TaON, TaBO, TaBON, TaCO, TaCON, and TaBOCN. Among these materials, the upper layer 24 preferably contains boron. In view of suppressing temporal change of degree of oxidization that occurs after forming the upper layer 42, the material of the upper layer 42 preferably has an oxygen content of 30 atom % or more, more preferably 40 atom % or more, and even more preferably 50 atom % or more. On the other hand, the oxygen content of the upper layer 42 is preferably 71.4% or less. The upper layer 42 containing more oxygen than stoichiometrically stable $Ta_2O_5$ may cause coarse surface roughness of the film.

The upper layer 42 is preferably formed of a material with a total content of tantalum and oxygen of 90 atom % or more, or a material with a total content of tantalum, oxygen, and boron of 90 atom % or more. Accordingly, content of other elements can be suppressed below 10 atom % ensuring good adhesiveness with a resist film, good in-plane CD uniformity, and CD linearity.

A thickness of the upper layer 42 of the hard mask film 4 is preferably 1 nm or more, and more preferably 2 nm or more to ensure in-plane distribution uniformity of a thickness of the upper layer 42. A ratio of a thickness of the upper layer 42 (Du) to a total thickness of the hard mask film 4 (Dt) (hereafter may be referred to as Du/Dt ratio) is preferably 0.7 or less, more preferably 0.5 or less, and even more preferably 0.3 or less. With the above configuration of the hard mask film 4, reduction of the etching rate of the entire hard mask film 4 to fluorine-based gas can be suppressed.

The hard mask film 4 can have an intermediate layer between the upper layer 42 and the lower layer 41, which is formed of a material that can be patterned by dry-etching with fluorine-based gas. The hard mask film 4 can have a lowermost layer between the lower layer 41 and the absorber film 3, which is formed of a material that can be patterned by dry-etching with fluorine-based gas. Further, at least anyone of the upper layer 42 and the lower layer 41 can have a structure with a composition gradient in the thickness direction.

An inspection was actually made when a SiON film (Si:O:N=34 atom %:60 atom %:6 atom %) was applied to the lower layer 41 and a TaBO film (Ta:B:O=36 atom %:8 atom %:56 atom %) was applied to the upper layer 42 of the hard mask film 4. The etching rate of dry etching with fluorine-based gas was measured for each of the SiON film and the TaBO film. As a result, it was found that the etching rate of the TaBO film upper layer 42 was 2.48 times less than the etching rate of the SiON film lower layer 41. FIG. 3 shows a relationship between a ratio of a thickness of the upper layer 42 (Dup) relative to a total thickness of the hard mask film 4 (Dto) (Dup/Dto ratio) and a ratio of an etching rate of the entire hard mask film 4 (Eto) to an etching rate of a SiON single layer film (Esi) (may hereafter be referred to as Eto/Esi ratio), when the total thickness of the hard mask film 4 is fixed to a certain thickness. The result shows that Dup/Dto ratio of 0.7 or less can achieve 0.5 times or more Eto/Esi ratio. The result further shows that Dup/Dto ratio of 0.5 or less can achieve 0.57 times or more Eto/Esi ratio. Moreover, the result shows that Dup/Dto ratio of 0.3 or less can achieve 0.7 times or more Eto/Esi ratio.

The same tendency is seen when another material containing tantalum and oxygen is applied to the lower layer 41 and another material containing silicon and oxygen is applied to the upper layer 42. Incidentally, it is preferable for the hard mask film 4, within the scope of $0.07 \leq Rd \leq 0.92$ where Eto/Esi ratio is Re and Dup/Dto ratio is Rd, to satisfy the following equation (1):

$$Re \geq 0.4047 \times Rd^4 - 1.264 \times Rd^3 + 1.694 \times Rd^2 - 1.431 \times Rd + 0.9995 \qquad \text{Equation (1)}$$

Resist Film

In the mask blank 100, a resist film formed of an organic-based material is preferably formed at a film thickness of 100 nm or less in contact with a surface of the hard mask film 4. In the case of a fine pattern compatible with the DRAM hp32 nm generation, SRAF (Sub-Resolution Assist Feature) having a line width of 40 nm may be provided in an absorber film pattern that is to be formed in the absorber film 3. However, also in this case, as described above, a film thickness of the resist film can be suppressed as a result of providing the hard mask film 4, and as a consequence, a cross-sectional aspect ratio of the resist pattern formed of this resist film can be set as low as 1:2.5. Therefore, collapse or peeling off of the resist pattern during the development, rinsing, etc. of the resist film can be suppressed. Incidentally, the resist film preferably has a film thickness of 80 nm or less. The resist film is preferably a resist for electron beam writing exposure, and it is more preferable that the resist is a chemically amplified resist.

[Manufacturing Procedure of Mask Blank]

The mask blank 100 of the above structure is manufactured through the following procedure. First, a transparent substrate 1 is prepared. This transparent substrate 1 includes an end surface and main surfaces polished into a predetermined surface roughness (e.g., root mean square roughness Rq of 0.2 nm or less in an inner region of a square of 1 μm side), and thereafter subjected to predetermined cleaning treatment and drying treatment.

Next, a phase shift film 2 is formed on the transparent substrate 1 by sputtering method. After the phase shift film 2 is formed, annealing is carried out at a predetermined heating temperature. Next, the absorber film 3 is formed on the phase shift film 2 by sputtering method. Subsequently, the hard mask film 4 having the upper layer 42 and the lower layer 41 is formed on the absorber film 3 by sputtering method. In formation of each layer by sputtering method, a sputtering target and sputtering gas containing materials forming each layer at predetermined composition ratio are used, and moreover, mixed gas of noble gas and reactive gas mentioned above is used as sputtering gas as necessary. Next, a resist film is formed by coating methods such as spin coating on the surface of the hard mask film 4 to complete the mask blank 100.

[Manufacturing Method of Phase Shift Mask]

Next, the manufacturing method of a phase shift mask according to this embodiment will be explained, with the manufacturing method of a half tone phase shift mask using the mask blank 100 of the configuration shown in FIG. 1 as an example.

First, a resist film is formed on the hard mask film 4 of the mask blank 100 by spin-coating. Next, a first pattern (phase shift film pattern) to be formed in the phase shift film 2 is written on the resist film by exposure writing with an electron beam. Thereafter, the resist film is subjected to predetermined treatments such as PEB treatment, developing treatment, and post-baking treatment, and a resist pattern 5a is formed on the hard mask film 4 of the mask blank 100 (see FIG. 2(a)).

Next, the hard mask film 4 is subjected to dry etching using fluorine-based gas with the resist pattern 5a as a mask, and a hard mask pattern 4a including an upper layer pattern 42a and a lower layer pattern 41a is formed (see FIG. 2(b)). Subsequently, the resist pattern 5a is removed. Incidentally, dry etching of the absorber film 3 can be carried out with the resist pattern 5a remaining. In such a case, the resist pattern 5a is eliminated upon dry etching of the absorber film 3.

Next, dry etching is carried out using mixed gas of chlorine and oxygen with the hard mask pattern 4a as a mask, and a light shielding pattern 3a as a thin film pattern is formed in the absorber film 3 as a thin film for pattern formation (see FIG. 2(c)).

Subsequently, dry etching is carried out using fluorine-based gas with the absorber film pattern 3a as a mask, a phase shift film pattern 2a is formed in the phase shift film 2 while the hard mask film pattern 4a is removed (see FIG. 2(d)). Next, a resist film is formed on the absorber film pattern 3a by spin coating. An absorber film pattern that should be formed in the absorber film 3 is written to the resist film by exposure with an electron beam. Thereafter, predetermined treatments such as a developing treatment are carried out, and a resist film having a resist pattern 6b is formed (see FIG. 2(e)).

Next, dry etching is carried out using mixed gas of chlorine-based gas and oxygen gas with the resist pattern 6b as a mask, and an absorber film pattern 3b is formed in the absorber film 3 (see FIG. 2(f)). Further, the resist pattern 6b is removed, predetermined treatments such as cleaning are carried out, and a phase shift mask 200 is obtained (see FIG. 2(g)).

Incidentally, there is no particular limitation to chlorine-based gas to be used for the dry etching in the manufacturing step described above, as long as Cl is included. Examples of the chlorine-based gas includes $Cl_2$, $SiCl_2$, $CHCl_3$, $CH_2Cl_2$, $CCl_4$, and $BCl_3$. Further, there is no particular limitation to fluorine-based gas to be used for the dry etching in the manufacturing step described above, as long as F is included. Examples of the fluorine-based gas includes $CHF_3$, $CF_4$, $C_2F_6$, $C_4F_8$, and $SF_6$. Particularly, fluorine-based gas free of C can further reduce damage on a glass substrate for having a relatively low etching rate to a glass substrate.

The phase shift mask 200 manufactured through the above steps has a configuration where the transparent substrate 1 has a phase shift film pattern 2a and an absorber film pattern 3b stacked in this order from the transparent substrate 1 side.

In the manufacturing method of the phase shift mask explained above, the phase shift mask 200 is manufactured using the mask blank 100 explained in FIG. 1. In the mask blank 100 used in manufacture of such a phase shift mask, the hard mask film 4 includes a stacked structure of the lower layer 41 and the upper layer 42, the lower layer 41 is formed of a material containing silicon and oxygen, the upper layer 42 is formed of a material containing tantalum and oxygen with an oxygen content of 30 atom % or more, and the ratio of a thickness of the upper layer 42 relative to a total thickness of the hard mask film 4 is 0.7 or less. Accordingly, the phase shift mask 200 can be manufactured having a high pattern resolution, in-plane CD uniformity, and CD linearity, while preventing reduction of an etching rate of the entire hard mask film 4. Through the above action, the phase shift mask 200 with excellent pattern precision can be manufactured.

While the embodiment explains a mask blank for manufacturing the phase shift mask 200 as a photomask, this invention is not limited thereto, and the invention can be applied to a mask blank for, for example, manufacturing a binary mask or a dug-down Levenson type phase shift mask.

EXAMPLES

The embodiment of this invention is described in greater detail below together with examples.

Example 1

[Manufacture of Mask Blank]

In view of FIG. 1, a transparent substrate 1 formed of a synthetic quartz glass with a size of a main surface of about 152 mm×about 152 mm and a thickness of about 6.35 mm was prepared. An end surface and main surfaces of the transparent substrate 1 were polished to a predetermined surface roughness (0.2 nm or less Rq), and thereafter subjected to predetermined cleaning treatment and drying treatment.

Next, a high transmitting layer (Si:N=44 atom %:56 atom %) of the phase shift film 2 was formed at a thickness of 8.0 nm on the transparent substrate 1. Concretely, the high transmitting layer was formed by placing the transparent substrate 1 in a single-wafer RF sputtering apparatus, and by reactive sputtering (RF sputtering) using a silicon (Si) target with mixed gas of krypton (Kr), helium (He), and nitrogen ($N_2$) as sputtering gas. The composition of the high transmitting layer was obtained as a result of measurement using an X-ray photoelectron spectroscopy (XPS). The same applies to other films hereafter.

Next, a low transmitting layer (Si:N=62 atom %:38 atom %) of the phase shift film 2 was formed at a thickness of 3.5 nm on the high transmitting layer. Concretely, the low transmitting layer was formed by placing the transparent substrate 1 with the high transmitting layer stacked thereon in a single-wafer RF sputtering apparatus, and by reactive sputtering (RF sputtering) using a silicon (Si) target with mixed gas of krypton (Kr), helium (He), and nitrogen ($N_2$) as sputtering gas.

Next, in contact with a surface of the low transmitting layer 21 of the transparent substrate 1 having formed thereon one set of the stacked structure of the high transmitting layer and the low transmitting layer stacked in this order, four sets of the stacked structure of the high transmitting layer and the low transmitting layer were further formed through the same procedure. Further, an uppermost layer was formed at a thickness of 8.0 nm in contact with a surface of the low transmitting layer that is the farthest from the transparent substrate 1 under the same film forming conditions as in forming the high transmitting layer. Through the above procedure, a phase shift film 2 having a structure totaling eleven layers, which includes five sets of a stacked structure of the high transmitting layer and the low transmitting layer, and having the uppermost layer thereon, on the transparent substrate 1 was formed at a total film thickness of 65.5 nm.

Next, the transparent substrate 1 having the phase shift film 2 formed thereon was subjected to heat treatment for reducing film stress of the phase shift film 2 and for forming an oxidization layer on the surface layer. Concretely, the heat treatment was carried out using a heating furnace (electric furnace) at a heating temperature of 500° C. in the atmosphere for one hour. The transmittance rate and phase difference of the phase shift film 2 after the heat treatment to a light of 193 nm wavelength were measured using a phase shift measurement apparatus (MPM193 manufactured by Lasertec), and the transmittance rate was 5.9% and the phase difference was 175.9 degrees.

Next, the transparent substrate 1 having the phase shift film 2 formed thereon was placed in a single-wafer DC sputtering apparatus, and reactive sputtering (DC sputtering) was carried out using a chromium (Cr) target under a mixed gas environment of argon (Ar), carbon dioxide ($CO_2$), and helium (He). Thus, an absorber film (CrOC film Cr:O:C=55 atom %:30 atom %:15 atom %) 3 formed of chromium, oxygen, and carbon was formed at a film thickness of 43 nm in contact with the phase shift film 2.

Next, the transparent substrate 1 having the absorber film (CrOC film) 3 formed thereon was subjected to heat treatment. Concretely, the heat treatment was carried out using a hot plate at a heating temperature of 280° C. in the atmosphere for five minutes. After the heat treatment, a spectrophotometer (Cary4000 manufactured by Agilent Technologies) was used on the transparent substrate 1 having the phase shift film 2 and the absorber film 3 stacked thereon to measure an optical density of the stacked structure of the phase shift film 2 and the absorber film 3 to ArF excimer laser light wavelength (about 193 nm), confirming the value of 3.0 or more.

Next, the lower layer (SiON film Si:O:N=34 atom %:60 atom %:6 atom %) 41 of the hard mask film 4 was formed at a thickness of 5.5 nm on the absorber film 3. Concretely, the lower layer 41 was formed by placing the transparent substrate 1 having the phase shift film 2 and the absorber film 3 stacked thereon in a single-wafer DC sputtering apparatus, and by DC sputtering using a silicon (Si) target with argon (Ar) gas, oxygen ($O_2$) gas, and nitrogen ($N_2$) gas as sputtering gas.

Next, the upper layer (TaBO film Ta:B:O=36 atom %:8 atom %:56 atom %) 42 was formed at a thickness of 2 nm on the lower layer 41. Concretely, the upper layer 42 was formed by placing the transparent substrate 1 having the phase shift film 2, the absorber film 3, and the lower layer 41 stacked thereon in a single-wafer DC sputtering apparatus, and by DC sputtering using a mixed target of tantalum (Ta) and boron (B) (Ta:B=4:1 atomic ratio) with argon (Ar) gas and oxygen (O) gas as sputtering gas. A ratio of a thickness of the upper layer 42 relative to a total thickness of the hard mask film 4 was 0.27, satisfying the condition of 0.7 or less. Further, a predetermined cleaning treatment was carried out to form a mask blank 100 of Example 1.

On each of another plurality of transparent substrates 1, a hard mask film 4 including a lower layer 41 and an upper layer 42 was formed under the same film forming conditions as Example 1, and a plurality of substrates with a hard mask film was manufactured. On the hard mask film 4 of each substrate with a hard mask film, a resist film was formed at a thickness of 80 nm. Next, a test pattern (design line width 200 nm) was written by exposure with different writing densities on the resist films of three substrates each having a hard mask film. The writing densities were set to be 10%, 50%, and 90%. The resist films on the three substrates each having a hard mask film were developed, and a resist pattern was formed on the hard mask film 4. CD values of all test patterns of the resist pattern on each substrate with a hard mask film were measured, using CD-SEM (Critical Dimension-Scanning Electron Microscope). Based on the measured CD value, in-plane CD uniformity $3\sigma$ (three times the standard deviation $\sigma$) of the resist pattern on each substrate with a hard mask film was calculated. Further, the average value of each $3\sigma$ of the resist patterns on the three transparent substrates 1 was calculated. The average value of the in-plane CD uniformity $3\sigma$ was 1.42 nm, which was satisfactory.

On the other hand, a test pattern was written by exposure with a different design line width on the resist films of remaining substrates with a hard mask film. Thereafter, the resist films were developed, and a resist pattern was formed on the hard mask film 4. CD values of all test patterns of the resist pattern formed on the substrate with a hard mask film were measured, using CD-SEM. The tendency of CD linearity, which is a correlation of a design line width and a CD value, was examined based on the measured CD value, discovering that the increase width of CD value that varies along with reduction of design line width was small, which is a good tendency. It was also found that a test pattern with minute line width (line width 40 nm) can be resolved with high precision. In view of these results, it was found that by applying the configuration of the hard mask film 4 of Example 1, good properties in pattern resolution, in-plane CD uniformity, and CD linearity can be obtained when a resist pattern was formed on the hard mask film 4.

[Manufacture of Phase Shift Mask]

Next, a half tone phase shift mask 200 of Example 1 was manufactured through the following procedure using the mask blank 100 of Example 1. First, a resist film of a chemically amplified resist for electron beam writing was formed in contact with a surface of the hard mask film 4 by spin coating at a film thickness of 80 nm. Next, a first pattern, which is a phase shift film pattern to be formed in the phase shift film 2, was written by an electron beam on the resist film, predetermined developing and cleaning treatments were conducted, and a resist pattern 5a having the first pattern was formed (see FIG. 2(a)). The first pattern was formed to include a line-and-space pattern having a line width of 200 nm and a minute size (line width 30 nm) pattern.

Next, dry etching using $CF_4$ gas was conducted with the resist pattern 5a as a mask, and a hard mask pattern 4a including an upper layer pattern 42a and a lower layer pattern 41a was formed in the hard mask film 4 including an upper layer 42 and a lower layer 41 (see FIG. 2(b)). The resist pattern 5a after forming the hard mask pattern 4a remained with a sufficient film thickness. In-plane CD uniformity and CD linearity of the hard mask pattern 4a were examined using CD-SEM, which were confirmed as satisfactory. Further, all patterns including the minute size pattern of the resist pattern 5a were confirmed as formed in the hard mask film 4 at high precision. Incidentally, an etching rate of the entire hard mask film 4 (Eto) at this stage was suppressed at a reduction of 0.76 times the etching rate of a SiON film of a single layer structure (Esi) of the same thickness.

Next, the resist pattern 5a was removed. Subsequently, dry etching was conducted with mixed gas of chlorine gas ($Cl_2$) and oxygen gas ($O_2$) (gas flow ratio $Cl_2:O_2=13:1$) using the hard mask pattern 4a as a mask, and a light shielding pattern 3a was formed in the absorber film 3 (see FIG. 2(c)).

Next, dry etching was conducted using fluorine-based gas ($SF_6$+He) with the absorber film pattern 3a as a mask, and a phase shift film pattern 2a as a first pattern was formed in the phase shift film 2, and at the same time the hard mask pattern 4a was removed (see FIG. 2(d)).

Next, a resist film of a chemically amplified resist for electron beam writing was formed on the absorber film pattern 3a by spin coating at a film thickness of 150 nm. Next, a second pattern, which is a pattern to be formed in the absorber film (pattern including light shielding band pattern), was exposed and written in the resist film, further subjected to predetermined treatments such as developing, and a resist pattern 6b having the absorber film pattern was formed (see FIG. 2(e)). Subsequently, dry etching was conducted with mixed gas of chlorine gas ($Cl_2$) and oxygen gas ($O_2$) (gas flow ratio $Cl_2:O_2=4:1$) using the resist pattern 6b as a mask, and an absorber film pattern 3b was formed in the absorber film 3 (see FIG. 2(f)). Further, the resist pattern 6b was removed, predetermined treatments such as cleaning were carried out, and the phase shift mask 200 was obtained (see FIG. 2(g)).

In-plane CD uniformity and CD linearity of the phase shift film pattern 2a of the phase shift mask 200 of Example 1 manufactured through the above procedure were examined using CD-SEM, which were confirmed as satisfactory. Further, all patterns including the minute size pattern of the resist pattern 5a were confirmed as formed in the phase shift film 2 at high precision. Moreover, regarding the phase shift mask 200 of Example 1, a simulation of a transfer image was made when an exposure transfer was made on a resist film on a semiconductor device at an exposure light of 193 nm wavelength, using AIMS193 (manufactured by Carl Zeiss). The simulated exposure transfer image was inspected, and the design specification was fully satisfied.

Comparative Example 1

[Manufacture of Mask Blank]

A mask blank of Comparative Example 1 was manufactured through the same procedure as Example 1, except for the hard mask film 4. A hard mask film 4 of Comparative Example 1 had a single layer structure including silicon and oxygen, with a thickness of 15 nm. Concretely, by placing a transparent substrate 1 having a phase shift film 2 and an absorber film 3 stacked thereon in a single-wafer DC sputtering apparatus, and by DC sputtering using a silicon (Si) target with argon (Ar) gas, oxygen ($O_2$) gas, and nitrogen ($N_2$) gas as sputtering gas, a single layer structure hard mask film 4 (SiON film Si:O:N=34 atom %:60 atom %:6 atom %) was formed on the absorber film 3.

On each of another plurality of transparent substrates 1, a single layer hard mask film was formed under the same film forming conditions as Comparative Example 1, and a plurality of substrates with a hard mask film was manufactured. The average value of each 3σ of the resist patterns on the three substrates each having a hard mask film was calculated through the same procedure as Example 1. The average value of 3σ of the in-plane CD uniformity was 1.78 nm, which was relatively large (i.e., relatively large in-plane CD variation). The tendency of CD linearity, which is a correlation of a design line width and a CD value of the resist pattern formed in the substrate with a hard mask film, was examined through the same procedure as Example 1, discovering that the increase width of CD value that varies along with reduction of design line width tends to be relatively large. It was also found that the test pattern with minute line width had low resolution. In view of these results, it was found that by applying the configuration of the hard mask film 4 of Comparative Example 1, pattern resolution, in-plane CD uniformity, and CD linearity were low when a resist pattern was formed on the hard mask film 4.

[Manufacture of Phase Shift Mask]

Next, using the mask blank of Comparative Example 1, the phase shift mask of Comparative Example 1 was manufactured through the same procedure as Example 1, except that a surface of the hard mask film 4 was subjected to a silylation process by hexamethyldisilazane and that thereafter the resist film was formed by coating. The resist pattern 5a after forming the hard mask pattern 4a remained with a sufficient film thickness. On the other hand, in-plane CD uniformity and CD linearity of the hard mask pattern 4a were examined using CD-SEM, which were both found to be low, compared to the case of Example 1. In particular, the minute size pattern was not formed in the hard mask pattern 4a.

In-plane CD uniformity and CD linearity of the phase shift film pattern 2a of the phase shift mask 200 of Example 1 manufactured were examined using CD-SEM (Critical Dimension-Scanning Electron Microscope), which were both found as low compared to the case of Example 1. Further, the minute size pattern was not formed in the phase shift film pattern 2a. Further, on the phase shift mask of Comparative Example 1, a simulation of a transfer image was made when an exposure transfer was made on a resist film on a semiconductor device at an exposure light of wavelength 193 nm using AIMS193 (manufactured by Carl Zeiss), similar to Example 1. The exposure transfer image of this simulation was verified, and a transfer defect was confirmed. It is inferred that causes of an occurrence of the transfer defect are low CD linearity and low CD uniformity of the phase shift film pattern, and failure in formation of the minute size pattern.

Comparative Example 2

[Manufacture of Mask Blank]

A mask blank of Comparative Example 2 was manufactured by the same process as Example 1, except for the hard mask film 4. A hard mask film 4 of Comparative Example 2 had a single layer structure including tantalum, boron, and oxygen, with a thickness of 9.5 nm. Concretely, the hard mask film 4 was formed by placing a transparent substrate 1 having a phase shift film 2 and an absorber film 3 formed thereon in a single-wafer DC sputtering apparatus, and by DC sputtering using a mixed target of tantalum (Ta) and boron (B) (Ta:B=4:1 atomic ratio) with argon (Ar) gas and oxygen (O) gas as sputtering gas.

On each of another plurality of transparent substrates 1, a single layer hard mask film was formed under the same film forming conditions as Comparative Example 2, and a plurality of substrates with a hard mask film was manufactured. The average value of each 3σ of the resist patterns on the three substrates each having a hard mask film was calculated through the same procedure as Example 1. The average value of 3σ of the in-plane CD uniformity was 1.43 nm, which was satisfactory. The tendency of CD linearity, which is a correlation of a design line width and a CD value of the resist pattern formed on the substrate with a hard mask film, was examined using the same procedure as Example 1, discovering that the increase width of CD value that varies along with reduction of the design line width was small, which is a good tendency. It was also found that a test pattern with a minute line width can be resolved at high precision. In view of these results, it was found that by applying the configuration of the hard mask film 4 of Comparative Example 2, good properties in pattern resolution, in-plane CD uniformity, and CD linearity can be obtained when a resist pattern was formed on the hard mask film 4.

[Manufacture of Phase Shift Mask]

Next, using the mask blank of Comparative Example 2, a phase shift mask of Comparative Example 2 was manufactured through the same procedure as Example 1. It was confirmed that a resist pattern 5a after forming a hard mask pattern 4a was eliminated in some regions (including the minute size pattern). Further, in-plane CD uniformity and CD linearity of the hard mask pattern 4a were examined using CD-SEM, which were both found to be low, compared to the case of Example 1. Incidentally, the etching rate of the entire hard mask film 4 (Eto) at this stage was 2.48 times the etching rate of a SiON film of a single layer structure (Esi) of the same thickness, which was significantly low.

[Evaluation of Pattern Transfer Performance]

In-plane CD uniformity and CD linearity of the phase shift film pattern 2a of the phase shift mask 200 of Comparative Example 2 manufactured were examined using CD-SEM (Critical Dimension-Scanning Electron Microscope), which were both found to be low, compared to the case of Example 1. Further, on the phase shift mask of Comparative Example 2, a simulation of a transfer image was made when an exposure transfer was made on a resist film on a semiconductor device at an exposure light of wavelength 193 nm using AIMS193 (manufactured by Carl Zeiss), similar to Example 1. The exposure transfer image of this simulation was verified, and a transfer defect was confirmed. It is inferred that causes of occurrence of the transfer defect are low in-plane CD uniformity and low CD linearity of the phase shift film pattern 2a, and failure in formation of the minute size pattern.

DESCRIPTION OF REFERENCE NUMERALS

1 transparent substrate
2 phase shift film
2a phase shift pattern
3 absorber film
3a, 3b absorber film pattern
4 hard mask film
41 lower layer
42 upper layer
4a hard mask pattern
41a lower layer pattern
42a upper layer pattern
5a resist pattern
6b resist pattern
100 mask blank
200 phase shift mask

The invention claimed is:

1. A mask blank having a structure where a thin film for pattern formation and a hard mask film are stacked in this order on a transparent substrate,
   wherein the thin film is formed of a material containing chromium,
   wherein the hard mask film has a stacked structure of a lower layer and an upper layer,
   wherein the lower layer is formed of a material containing silicon and oxygen,
   wherein the upper layer is formed of a material containing tantalum and oxygen and containing the oxygen of 30 atom % or more, and
   wherein a ratio of a thickness of the upper layer relative to a total thickness of the hard mask film is 0.7 or less.

2. The mask blank according to claim 1, wherein the upper layer has a thickness of 1 nm or more.

3. The mask blank according to claim 1, wherein the hard mask film has a thickness of 4 nm or more and 14 nm or less.

4. The mask blank according to claim 1, wherein the upper layer contains boron.

5. The mask blank according to claim 1, wherein the lower layer is formed of a material with a total content of silicon and oxygen of 96 atom % or more, or a material with a total content of silicon, nitrogen, and oxygen of 96 atom % or more.

6. The mask blank according to claim 1, wherein the upper layer is formed of a material with a total content of tantalum and oxygen of 90 atom % or more, or a material with a total content of tantalum, oxygen, and boron of 90 atom % or more.

7. The mask blank according to claim 1, wherein the thin film is an absorber film.

8. The mask blank according to claim 7 comprising a phase shift film consisting of a material containing silicon between the transparent substrate and the absorber film.

9. A method of manufacturing a photomask using the mask blank according to claim 8, comprising the steps of:
   forming a resist pattern on a hard mask film of the mask blank,
   dry-etching the hard mask film with fluorine-based gas with the resist pattern as a mask to form a hard mask pattern,
   dry-etching the absorber film with mixed gas of chlorine and oxygen with the hard mask pattern as a mask to form an absorber film pattern, and
   dry-etching the phase shift film with fluorine-based gas with the absorber film pattern as a mask to form a phase shift film pattern while removing the hard mask pattern.

10. A method of manufacturing a photomask using the mask blank according to claim 1, comprising the steps of:
    forming a resist pattern on a hard mask film of the mask blank,
    dry-etching the hard mask film with fluorine-based gas with the resist pattern as a mask to form a hard mask pattern, and
    dry-etching the thin film for pattern formation with mixed gas of chlorine and oxygen with the hard mask pattern as a mask to form a thin film pattern.

* * * * *